United States Patent [19]
Lur et al.

[11] Patent Number: 5,358,733
[45] Date of Patent: Oct. 25, 1994

[54] STRESS RELEASE METALLIZATION FOR VLSI CIRCUITS

[75] Inventors: Water Lur, Taipei; J. Y. Wu, Dou-Lio, both of Taiwan

[73] Assignee: United Microelectronics Corporation, Hsinchu, Taiwan

[21] Appl. No.: 2,419

[22] Filed: Jan. 8, 1993

[51] Int. Cl.$^5$ .................... C23C 14/00; C23C 16/00
[52] U.S. Cl. ................................. 427/58; 427/96; 427/99; 29/840; 437/51
[58] Field of Search ............ 427/58, 96, 99; 29/840; 437/51; 204/192.25

[56] References Cited

U.S. PATENT DOCUMENTS

| | | | |
|---|---|---|---|
| 3,247,927 | 4/1966 | Cragg | 427/58 |
| 4,031,272 | 6/1977 | Khanna | 427/96 |
| 5,162,240 | 11/1992 | Saitou | 427/96 |

*Primary Examiner*—Shrive Beck
*Assistant Examiner*—Vi Duong Dang
*Attorney, Agent, or Firm*—George O. Saile

[57] ABSTRACT

A new metallization method for metal lines formation of a very large scale integrated circuit (VLSI) is described. The metal lines are formed in a "wavy" or "snaky" pattern. It is a "wavy" pattern when the metal line goes through a vertically vibratory path. It is a "snaky" pattern when a metal line goes through a horizontally vibratory path. This includes both uniform and random "wavy" and "snaky" patterns. A metal line can also be formed in a pattern that is both "wavy" and "snaky." For the "wavy" pattern, the topography under the metal lines is fabricated using, for example, field oxide. The "wavelength" can vary from 1 to 10 micrometers. A slight modification of the metal mask can produce the "snaky" structure of the metal line. The stresses will be released by a small curvature change of the metal line. For the contact structures, a multi-contact layout with "wavy" structure can release more stress than can a single-contact layout of the same contact area.

18 Claims, 7 Drawing Sheets

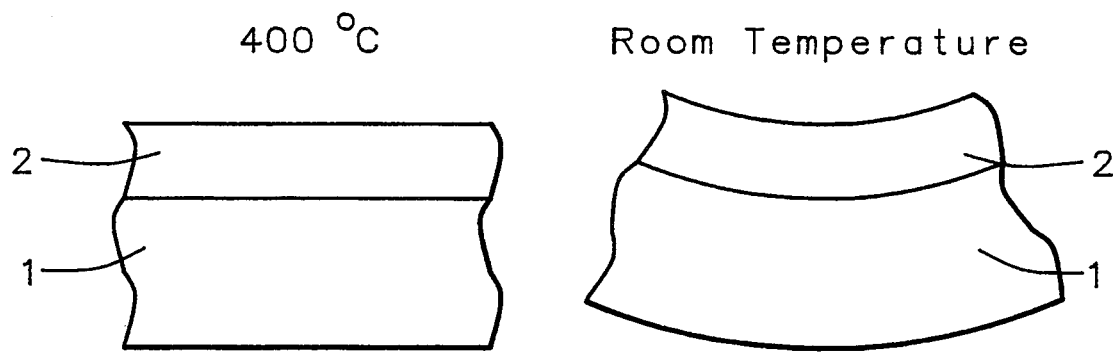
FIG. 1A
Prior Art
FIG. 1B
Prior Art
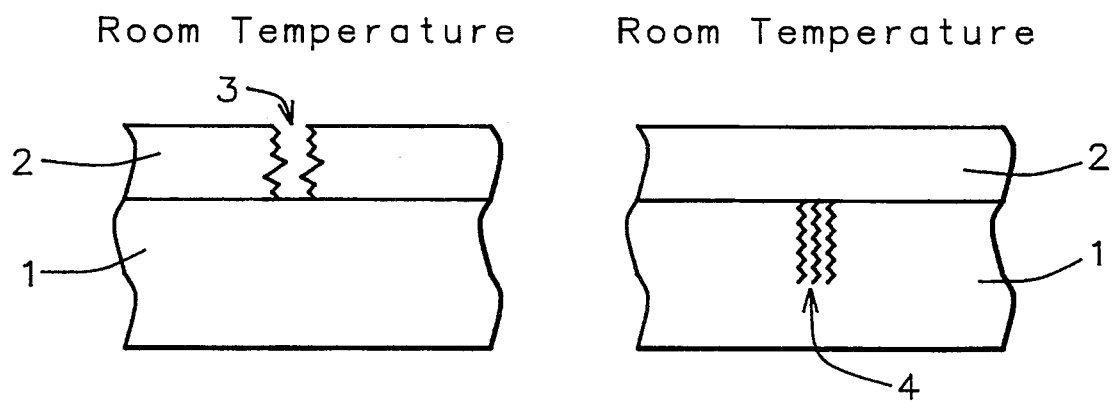
FIG. 1C
Prior Art
FIG. 1D
Prior Art

STRESS RELEASE METALLIZATION FOR VLSI CIRCUITS

BACKGROUND OF THE INVENTION

(1) FIELD OF THE INVENTION

This invention relates to the fabrication of integrated circuit devices and more particularly to a method of relieving stresses both in the metal layer and in the silicon substrate after metal lines formation.

(2) DESCRIPTION OF THE PRIOR ART

In order to get the smallest layout area, the metal lines at the periphery of a very large scale integrated circuit (VLSI) chip are always straight. Before the formation of the metal lines, the stress in the silicon substrate is released to a large extent by the thermal treatments and the generation of linear and/or planar defects. For instance, local oxidation of silicon to form active area islands, source/drain activation, BPSG densification and reflow, barrier layer formation, etc. are high-temperature processes. Point defects, linear defects and planar defects, e.g. vacancies, dislocation, stacking faults, are generated after thermal cycles as well as after other inadequate processes such as polysilicon etch, spacer etch, contact etch, etc.

In forming the metal lines, the metal is typically sputter deposited at a high temperature of about 400° C. in order to achieve a good step coverage. The insulating layer and passivation layer are usually deposited and process treated, such as spin-on-glass curing, at temperatures higher than 400° C. When the chip is cooled to room temperature, a strong compressive stress in the substrate and a strong tensile stress in the metal layer are generated. This is caused by the difference in the thermal coefficients of expansion of the substrate and the metal. For example, the thermal coefficients of expansion for silicon, silicon dioxide, and aluminum are about 4, 0.5, and $24 \times 10^{-6}$ parts per million per °C., respectively. The stresses are usually larger than $5 \times 10^9$ dyne/cm$^2$. The compressive stress in the silicon substrate will cause problems such as dislocations and stacking faults, junction leakage and junction breakdown voltages degradation. The tensile stress in the metal lines will cause problems such as stress migration, void formation, and reliability concerns. The considerable stress is also present in the intermetal dielectric layers and all overlayers to result in cracks, voids, metal stress migration, passivation failure, etc. These stresses are local functions and cannot be investigated by the global stress measurements taken after the metal has been patterned. The rugged topography within the chips can release most of these stresses; however, the straight metal lines especially at the periphery of the chips do not allow for stress release.

Referring now to FIG. 1A, there is illustrated a post-front-end-processed silicon substrate 1 on which a metal line 2 has been sputtered. (All layers and diffusions, etc., may be included in 1, but are not illustrated for the sake of simplicity). At 400° C., the system is under no stress. As the chip is cooled to room temperature, the tendency is for the metal layer, 2, to contract more than the substrate layer, 1, as shown in FIG. 1B. Since the chip is not free to bend as illustrated in FIG. 1B, defects will occur such as a break, 3, in the metal line shown in FIG. 1C or crunching, 4, in the substrate as shown in FIG. 1D.

SUMMARY OF THE INVENTION

A principal object of the invention is to provide an effective and very manufacturable method to release stress in both the metal layers and substrate in an integrated circuit.

In accordance with the object of this invention, a new metallization method for metal lines formation of a very large scale integrated circuit (VLSI) is described. The metal lines are formed in a "wavy" or "snaky" pattern. It is a "wavy" pattern when the metal line goes through a vertically vibratory path. It is a "snaky" pattern when a metal line goes through a horizontally vibratory path. This includes both uniform and random "wavy" and "snaky" patterns. A metal line can also be formed in a pattern that is both "wavy" and "snaky." For the "wavy" pattern, the topography under the metal lines is fabricated using, for example, field oxide. The "wavelength" can vary from 1 to 10 micrometers. A slight modification of the metal mask can produce the "snaky" structure of the metal line. The stresses will be released by a small curvature change of the metal line. For the contact structures, a multi-contact layout with "wavy" structure can release more stress than can a single-contact layout of the same contact area.

Referring to FIG. 2A, there is shown a wavy metal line, 2, deposited over field oxide regions, 5, on silicon substrate, 1. When the chip is cooled to room temperature, FIG. 2B, the wavy metal line, 2, will tend to straighten rather than to break as in the prior art. This straightening will release the stress both in the metal line and in the substrate.

BRIEF DESCRIPTION OF THE DRAWINGS

In the accompanying drawings forming a material part of this description, there is shown:

FIGS. 1A, 1B, 1C, and 1D schematically illustrate in cross-sectional representation the stresses resulting from cooling the chip after metal line formation in the prior art.

DESCRIPTION OF THE PREFERRED EMBODIMENTS

Figure 2A:
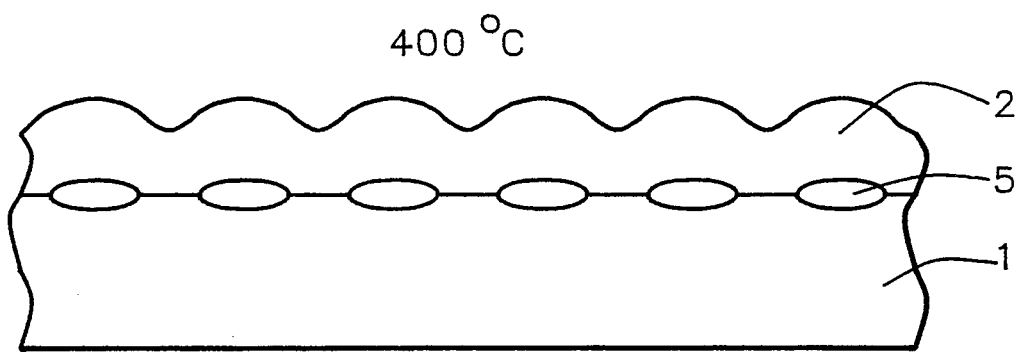
FIGS. 2A and 2B schematically illustrate in cross-sectional representation the stresses resulting from cooling the chip after metal lines have been formed in one preferred embodiment of the present invention.
Figure 2B:
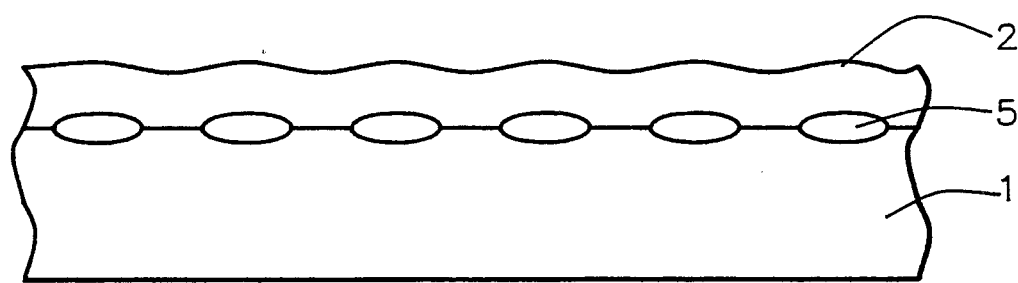
Figure 3:
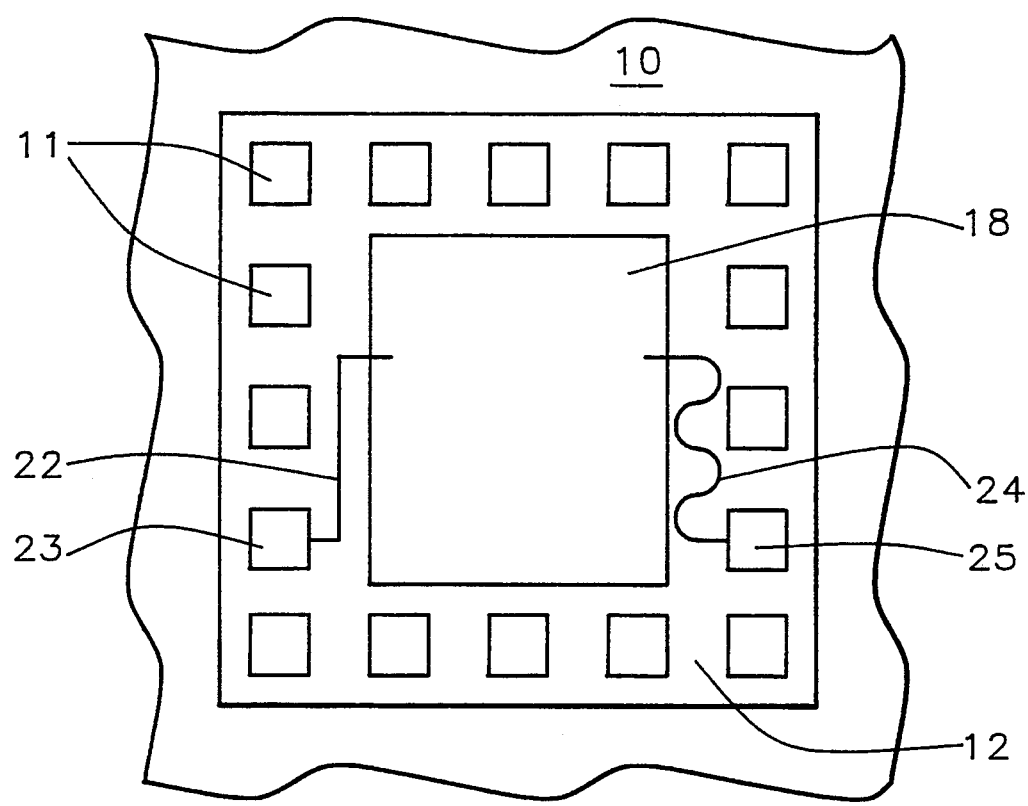
FIG. 3 schematically illustrates a top view of a VLSI chip.

Referring now more particularly to FIG. 3, there is shown a top view of a very large scale integrated circuit (VLSI) chip. On the silicon substrate 10 are bonding pads 11 around the periphery of the chip. The central area of the chip 18 contains the various semiconductor devices and connections. The bonding pads provide a means of electrically connecting the device areas of the chip to the package wiring. Metal line 22 connects a device area within the central portion 18 of the chip to one of the bonding pads 23. The bonding pad 23 in turn will be connected to the outside package wiring in a subsequent operation (not shown). Metal line 22 is straight as in the prior art. Metal line 24 connecting a device area within the central portion 18 to bonding pad 25 is a "wavy" or "snaky" line of the present invention. Many other metal lines will connect the bonding pads to device areas within the central area of a completed integrated circuit chip. Only metal lines 22 and 24 are illustrated for simplicity.

Figure 4A:
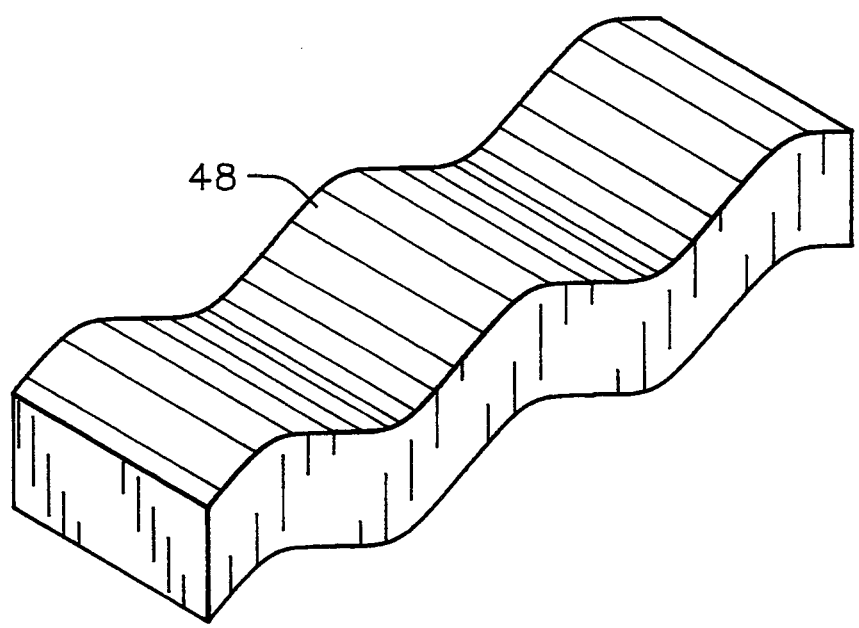
FIG. 4A schematically illustrates a wavy line.
Figure 4B:
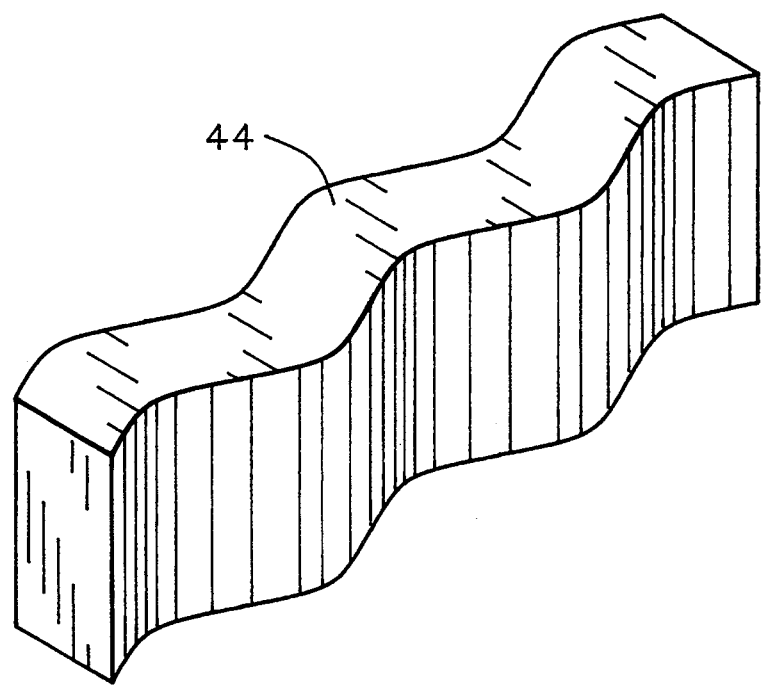
FIG. 4B schematically illustrates a snaky line.
Figure 4C:
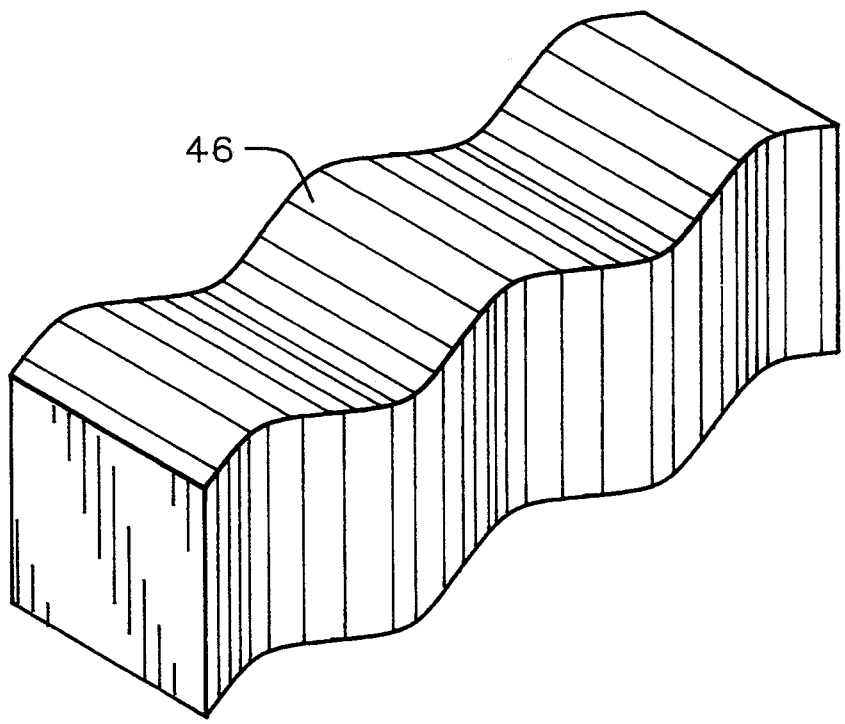
FIG. 4C schematically illustrates a line that is both wavy and snaky.

Both "wavy" and "snaky" lines may appear in the periphery area as well as in the central area of a chip. If the metal line to be formed is wide, i.e. its thickness is smaller than its width, a "wavy" line is preferred. A "wavy" line has a repeating wave pattern as shown by 48 in FIG. 4A. If the metal line is narrow, i.e. its thickness is larger than its width, a "snaky" line is preferred. A "snaky" line has a horizontally repeating wave pattern as shown by 44 in FIG. 4B. Furthermore, if the metal line is fabricated to be both "snaky" and "wavy" the stress will be minimum. 46 in FIG. 4C illustrates a metal line that is both "wavy" and "snaky." Metal line 24 in FIG. 3 will be a "wavy" line, such as 48 in FIG. 4A, a "snaky" line, such as 44 in FIG. 4B, or a line that is both "wavy" and "snaky," as 46 in FIG. 4C. In the art, layout designers always use straight lines.

Figure 5:
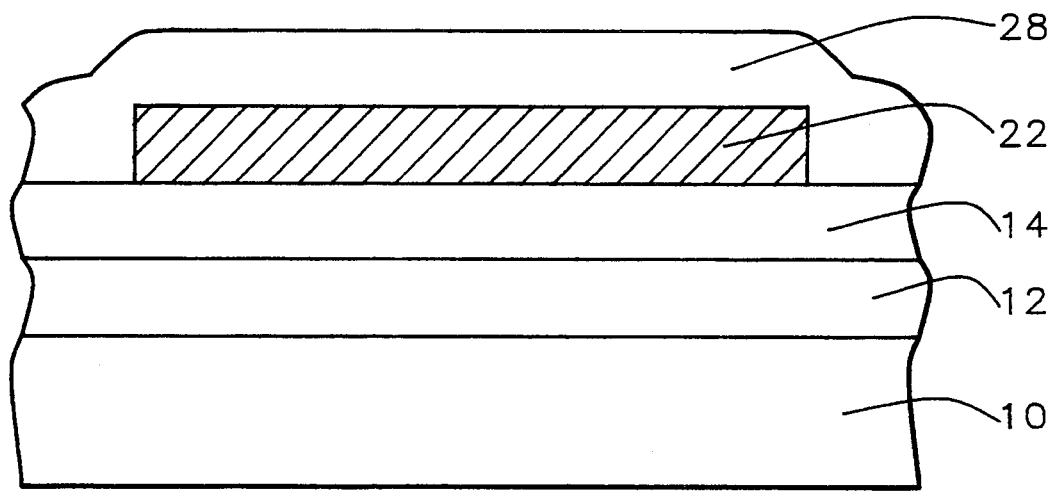
FIG. 5 schematically illustrates in cross-sectional representation a metal line formed according to prior art.

Referring now to FIG. 5, there is illustrated in cross-sectional representation, a view of the straight metal line 22 (as in FIG. 3). Field oxide regions 12 exist under the bonding pads as well as under the metal lines at the periphery. An insulating layer 14 composed of borophosphosilicate glass (BPSG), plasma-enhanced chemical vapor deposited (PECVD) oxide, or the like is formed over the field oxide regions 12. Metal line 22 is deposited at between room temperature to higher than 500° C. The metal line may be composed of aluminum, aluminum alloy, or any kind of good conducting material. A passivation layer 28 is formed over the metal layer 22. The insulating layer and passivation layer, shown here as one layer 14, are usually deposited and process treated at temperatures higher than 400° C. When the chip is cooled to room temperature, the tensile stress in the metal line 22 can cause dislocations in the silicon substrate and stress migration can cause voids in the metal. Compressive stress in the silicon can cause leakage problems.

Figure 6:
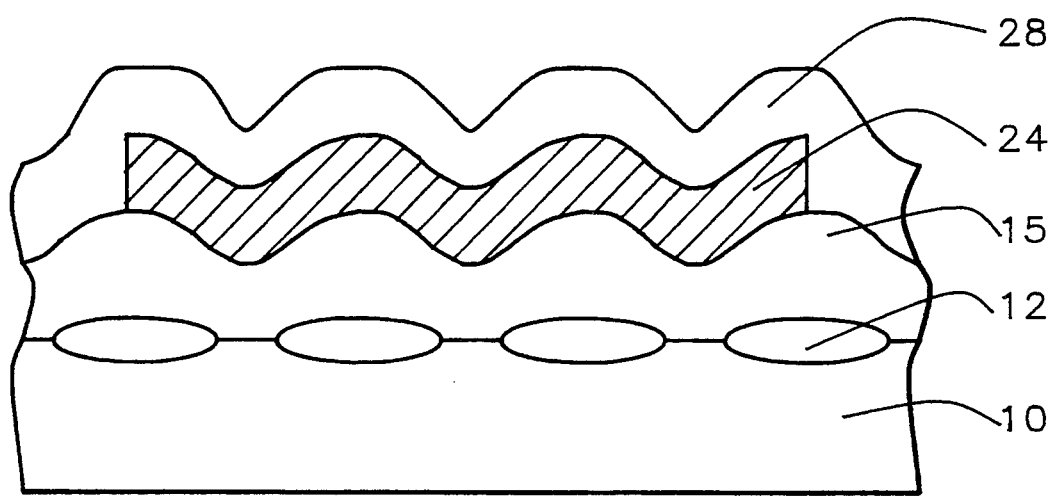
FIG. 6 schematically illustrates in cross-sectional representation a preferred embodiment of the present invention.

Referring now to FIG. 6, there is shown a cross-sectional representation of the "wavy" or "snaky" line 24 (as in FIG. 3). As in FIG. 5, field oxide regions 12 are formed locally in and on silicon substrate 10. Insulating layer 15 is formed over the field oxide regions 12. If the metal line to be formed is wide, a wavy pattern will be used. This is the pattern illustrated by 48 in FIG. 4A. The topography is built up in this layer 15 which may be composed of any one or more of the following: field oxide, borophosphosilicate glass, PECVD oxide, or polysilicon. The "wavelength" can be from about 1 to 10 micrometers. After the wave form has been created, the metal line 24 is sputter deposited in a "wavy" form over layer 15. If the metal line to be formed is narrow, a "snaky" pattern will be used by modifying the metal layer mask so that the metal line has a horizontally vibratory path. This is the pattern illustrated by 44 in FIG. 4B. The metal line could also be formed as both "wavy" and "snaky" as illustrated by 46 in FIG. 4C. As above, the metal layer is composed of aluminum, aluminum alloy, or any kind of good conducting material such as copper, silicon, etc. and is sputter or chemical vapor deposited at a temperature of between room temperature to higher than 500° C. A passivation layer and other insulating layer 28 are formed at moderate high temperatures, as above. When the chip is cooled to room temperature, the wavy or snaky line pattern of the metal line 24 will release the stress in both the metal line and the underlying silicon substrate, thus maintaining the integrity of the integrated circuit.

FIG. 6 illustrates a "wavy" or "snaky" metal line 24 between the bonding pads and the central area of the chip. This metal line 24 could also be any metal line within the central area of the chip. Formation of the "wavy" or "snaky" metal line within the central area of the chip is identical to that described for FIG. 6.

Figure 7A:
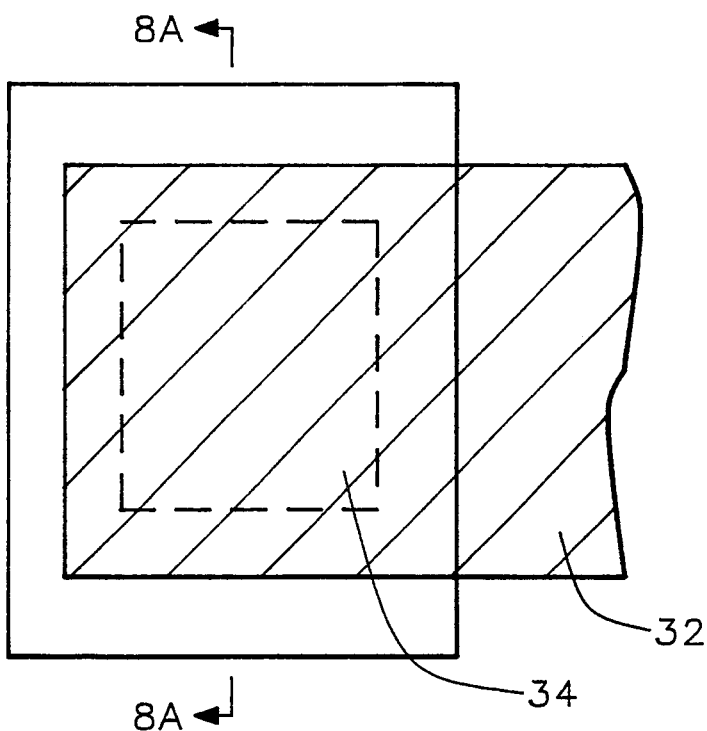
FIG. 7A schematically illustrates a top view of a prior art contact on a bonding pad at the periphery of a VLSI.

Referring now to FIG. 7A, there is shown a large contact 34. Metal line 32 represents the interconnection between circuit electrodes. Where the feature size is 1 micrometer, the usual contact area is 1 micrometer square. However, some contacts must be 2 to 10 times larger than usual. For example, if the contact electrode is a common source or drain and there is enough space, then the contact will be designed as large as possible to reduce contact resistance. This is the large contact of several micrometers square illustrated in FIG. 7A.

Figure 7B:
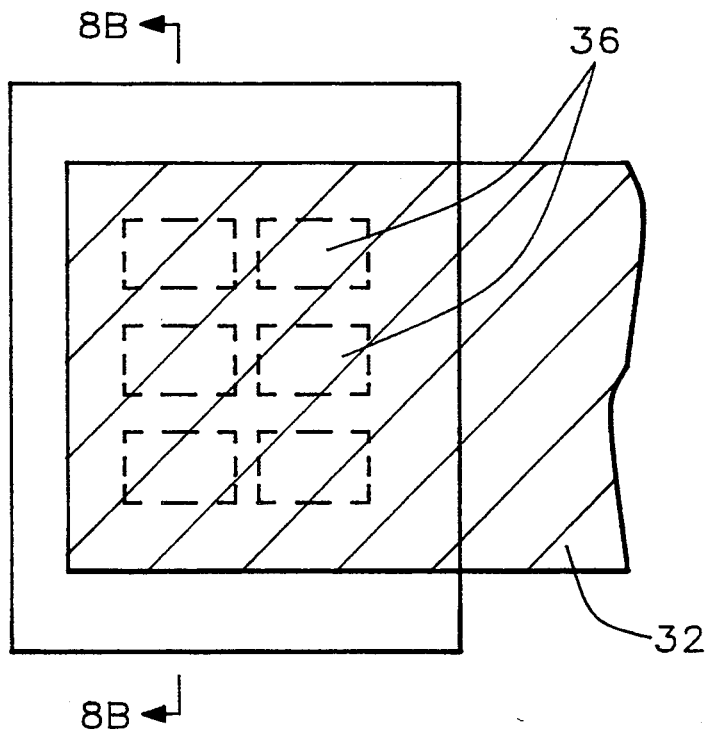
FIG. 7B schematically illustrates a top view of a contact of the present invention on a bonding pad at the periphery of a VLSI.

A multi-contact layout can release more stress than can a single-contact layout with the same contact area. A multi-contact layout is illustrated in FIG. 7B. The large contact 34 of FIG. 7A has been replaced with multiple smaller contacts 36 which provide substantially the same contact area as the large contact 34, but allow for a wavy structure.

Figure 8A:
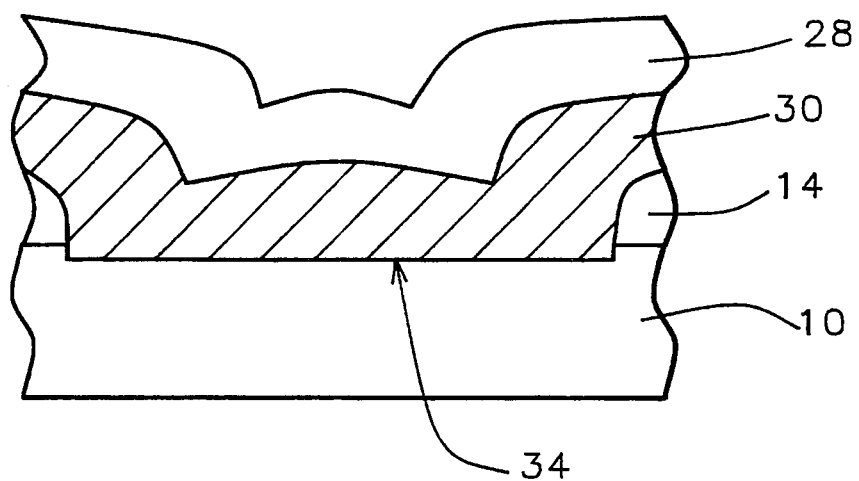
FIG. 8A schematically illustrates in cross-sectional representation a prior art contact shown in top view in FIG. 7A.

Referring now to FIG. 8A, there is illustrated in cross-sectional representation, a view of large contact 34 as shown in FIG. 7A. There is shown a portion of silicon substrate 10. Contact opening 34 has been made through insulation layer 14 to the substrate 10. The metal line 30 has been deposited into the contact opening and covered with passivation layer 28. Again, this structure does not allow for the release of stresses built up when the chip is cooled after metal high-temperature sputtering (e.g. 400°–500° C.) sputtering or after high-temperature insulating/passivation deposition.

Figure 8B:
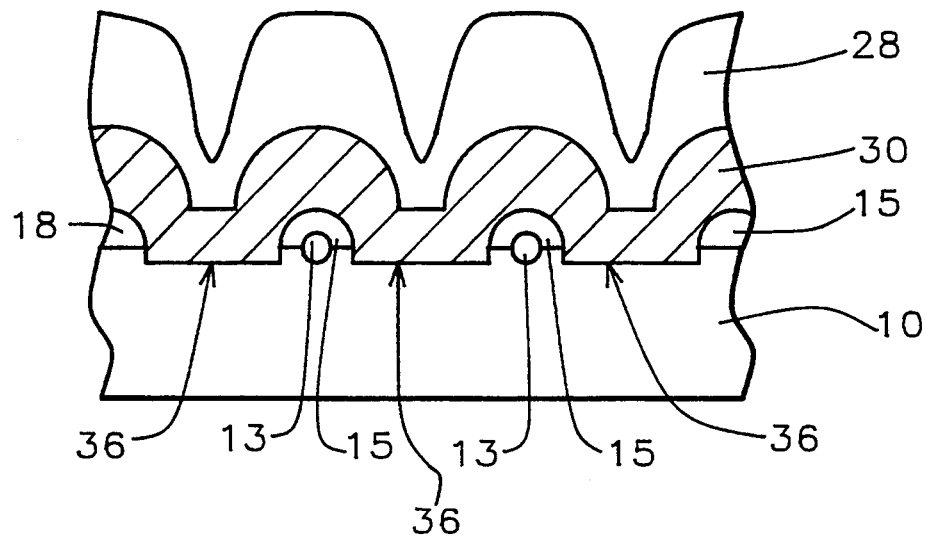
FIG. 8B schematically illustrates in cross-sectional representation a preferred embodiment of the present invention shown in top view in FIG. 7B.

Referring now to FIG. 8B, there is shown a cross-sectional representation of the multi-contact layout of FIG. 7B. A portion of silicon substrate 10 is illustrated. Additional field oxide regions 13 have been formed. Insulator layer 15 has been formed over the field oxide regions. Multiple contact openings 36 have been made through the insulator layer 15 to the substrate 10. The field oxide 12 (not seen in FIG. 8B) and insulator layer 15 have been formed so that a wave pattern is evident. Metal layer 30 is deposited into the contact openings and covering insulating layer 15 in a wave pattern. Passivation layer 28 covers all. When the chip is cooled after all high-temperature processes, the "wavy" metal line making multiple contacts with the substrate will tend to straighten somewhat, releasing the stress in both the metal line and the substrate.

The following Example is given in an effort to point out the important problems solved by features of the invention over that of the prior art and is not intended to limit the invention in any way.

EXAMPLE

An experiment has been carried out in order to test the stresses involved in cooling chips after metal sputtering. Two wafers were used in the test. Wafer A consisted of real chip up and down patterns on a silicon substrate. Field oxide regions separated the chips. Wafer B consisted of a layer of silicon dioxide over a silicon substrate with no chip patterns. Aluminum was sputtered at between 300° and 500° C. to a thickness of about 10,000 Angstroms over the surfaces of both wafers A and B. Each wafer was measured for stress before and after sputtering. A laser beam was used to scan each wafer. The reflected beam was used to calculate the curvature of the wafer from which the tensile stress was derived. The following table shows the resulting stress calculations:

TABLE 1

| Wafer | Tensile Stress |
| --- | --- |
| A | $\sim 2 \times 10^9$ dyne/cm$^2$ |
| B | $\sim 3 \times 10^9$ dyne/cm$^2$ |

As can be seen from Table 1, the stress on Wafer B is higher than that on Wafer A. Wafer B is "flat" since it has no chip patterns on it. Wafer A is partially "flat" and partially "wavy" because of the chip patterns, thereby resulting in less stress.

While the invention has been particularly shown and described with reference to the preferred embodiments thereof, it will be understood by those skilled in the art that various changes in form and details may be made without departing from the spirit and scope of the invention.

What is claimed is:

1. The method of stress releasing metallization in a very large scale integrated circuit (VLSI) comprising:
providing semiconductor device structures in and on a semiconductor substrate within the central area of said VLSI circuit;
depositing a metal line in a wavy pattern on said VLSI circuit wherein said metal line connects said semiconductor device structures to a bonding pad on the periphery of said VLSI circuit whereby:
the topography of a layer underlying said metal line is shaped into a pattern comprising a repeating wave formation; and
said metal line is deposited on top of said repeating wave formation pattern; and
said wavy pattern of said metal line acts to release compressive stress in said substrate and tensile stress in said metal line.

2. The method of claim 1 wherein said topography of said layer underlying said metal line is shaped into said pattern comprising a repeating wave formation using one or more of the group consisting of silicon oxide, phosphosilicate glass, and polysilicon.

3. The method of claim 1 wherein said topography of said layer underlying said metal line is shaped into said pattern comprising a repeating wave formation using multiple contact openings to a large contact wherein said multiple contact openings provide substantially the same contact area as provided by said needed large contact.

4. The method of claim 1 wherein said repeating wave formation has a wavelength of between 1 to 10 microns.

5. The method of claim 1 wherein said wavy pattern is used for said metal lines only in the said periphery area of said integrated circuit.

6. The method of claim 1 wherein said wavy pattern is used for said metal lines both in the said periphery area and within the said central area of said integrated circuit.

7. The method of claim 1 wherein the thickness of said metal line is smaller than its width.

8. The method of claim 1 wherein said metal line is also deposited in a snaky pattern as well as said wavy pattern on said integrated circuit by use of an appropriate metal layer mask wherein said snaky pattern comprises a horizontally repeating wave pattern.

9. The method of stress releasing metallization in a very large scale integrated circuit (VLSI) comprising:
providing semiconductor device structures in and on a semiconductor substrate within the central area of said VLSI circuit wherein said device structures comprise at least one dielectric or passivation layer;
depositing a metal line in a snaky pattern on said VLSI circuit wherein said metal line connects said semiconductor device structures to a bonding pad on the periphery of said VLSI circuit whereby an appropriate metal layer mask having a horizontally repeating wave pattern is used; and
said snaky pattern of said metal line acts to release compressive stress in said substrate and tensile stress in said metal line.

10. The method of claim 9 wherein the thickness of said metal line is larger than its width.

11. The method of claim 9 wherein said snaky metal structures also result in stress release in all said dielectric or passivation layers of said VLSI circuit to prevent stress-induced cracks, voids, extension leakage.

12. The method of claim 9 wherein said repeating wave pattern has a wavelength of between 1 to 10 microns.

13. The method of claim 9 wherein said snaky pattern is used for said metal lines only in the said periphery area of said integrated circuit.

14. The method of claim 9 wherein said snaky pattern is used for said metal lines both in the said periphery area and within the said central area of said integrated circuit.

15. The method of stress releasing metallization in very a large scale integrated circuit (VLSI) wherein large contacts are needed comprising:
providing semiconductor device structures in and on a semiconductor substrate;
providing multiple contact openings to said large contact through a said dielectric layer wherein the combined areas of said multiple contact openings provide substantially the same contact area as provided by said needed large contact and the resulting topography of said dielectric layer in which said multiple contact openings are made is a repeating wave pattern;
depositing metal lines on top of said repeating wave pattern whereby contact is made to said semiconductor device structures in and on said semiconductor substrate through said multiple contact openings; and said repeating wave pattern of said metal lines acts to release compressive stress in said substrate and tensile stress in said metal line.

16. The method of claim 15 wherein said wavy pattern of said metal lines also results in stress release in all dielectric or passivation layers of said VLSI circuit to prevent stress-induced cracks, voids, extension leakage.

17. The method of claim 15 wherein said metal line is also deposited in a snaky pattern as well as said wavy pattern on said integrated circuit by use of an appropriate metal layer mask wherein said snaky pattern comprises a horizontally repeating wave pattern.

18. The method of claim 17 wherein said repeating wave pattern for both wavy and snaky patterns has a wavelength of between 1 to 10 microns.

* * * * *